United States Patent
Yahagi

(10) Patent No.: US 8,507,898 B2
(45) Date of Patent: Aug. 13, 2013

(54) ORGANIC THIN FILM TRANSISTOR, METHOD FOR MANUFACTURING THE SAME, DISPLAY MEMBER USING THE ORGANIC THIN FILM TRANSISTOR, AND DISPLAY

(75) Inventor: Isao Yahagi, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 355 days.

(21) Appl. No.: 13/001,514

(22) PCT Filed: Jun. 22, 2009

(86) PCT No.: PCT/JP2009/061327
§ 371 (c)(1),
(2), (4) Date: Feb. 18, 2011

(87) PCT Pub. No.: WO2010/001758
PCT Pub. Date: Jan. 7, 2010

(65) Prior Publication Data
US 2011/0147726 A1    Jun. 23, 2011

(30) Foreign Application Priority Data

Jun. 30, 2008  (JP) ................. P2008-171160

(51) Int. Cl.
*H01L 35/24* (2006.01)
(52) U.S. Cl.
USPC ................. 257/40; 257/E51.001
(58) Field of Classification Search
USPC ............. 257/40, E51.001
See application file for complete search history.

(56) References Cited

U.S. PATENT DOCUMENTS

| | | |
|---|---|---|
| 2001/0036591 A1 | 11/2001 | Schulz et al. |
| 2004/0222412 A1 | 11/2004 | Bai et al. |
| 2005/0279995 A1 | 12/2005 | Shin et al. |
| 2006/0214159 A1 | 9/2006 | Nakayama et al. |
| 2006/0231908 A1 | 10/2006 | Liu et al. |
| 2006/0234430 A1 | 10/2006 | Liu et al. |

FOREIGN PATENT DOCUMENTS

| | | |
|---|---|---|
| CN | 1734350 A | 2/2006 |
| JP | 2001-181221 A | 7/2001 |
| JP | 2003-258260 A | 9/2003 |

(Continued)

OTHER PUBLICATIONS

Office Action issued Oct. 2, 2012 in Japanese Patent Appln. No. 2008-171160 with English translation.

(Continued)

*Primary Examiner* — Anthony Ho
(74) *Attorney, Agent, or Firm* — Sughrue Mion, PLLC

(57) ABSTRACT

An object of the present invention is to provide an organic thin film transistor a gate insulating film of which can be formed at a low temperature. The organic thin film transistor of the present invention includes a source electrode, a drain electrode, an organic semiconductor layer which becomes a current path between the source electrode and the drain electrode, a gate electrode which controls an electric current passing through the current path, and an insulating layer which insulates the organic semiconductor layer from the gate electrode, wherein the insulating layer is formed of a cured substance of a composition containing a first compound having, in the molecule, two or more groups that produce a functional group which reacts with an active hydrogen group by electromagnetic radiations or heat, and a second compound having two or more active hydrogen groups in the molecule, where at least one of the first compound and the second compound is a polymer compound.

7 Claims, 3 Drawing Sheets

(56) References Cited

FOREIGN PATENT DOCUMENTS

| | | |
|---|---|---|
| JP | 2004-72049 A | 3/2004 |
| JP | 2005-113014 A | 4/2005 |
| JP | 2006-295166 A | 10/2006 |
| JP | 2006-303465 A | 11/2006 |
| JP | 2007-42852 A | 2/2007 |
| JP | 2007-177041 A | 7/2007 |
| JP | 2007-251093 A | 9/2007 |

OTHER PUBLICATIONS

Machine-generated English translation of JP 2003-258260 filed Sep. 12, 2008.

Machine-generated English translation of JP 2004-072049 filed Mar. 4, 2004.

Hagen Klauk et al., "High-mobility polymer gate dielectric pentacene thin film transistors", Journal of Applied Physics, vol. 92, No. 9, Nov. 1, 2002, pp. 5259-5263.

International Preliminary Report on Patentability for PCT/JP2009/061327 dated Feb. 17, 2011.

Extended European Search Report issued Aug. 11, 2011, in European Patent Application No. 09773336.4.

Second Office Action issued Dec. 28, 2012 in Chinese Patent Application No. 200980124794.X to Sumitomo Chemical Co., Ltd., with translation.

ORGANIC THIN FILM TRANSISTOR, METHOD FOR MANUFACTURING THE SAME, DISPLAY MEMBER USING THE ORGANIC THIN FILM TRANSISTOR, AND DISPLAY

CROSS REFERENCE TO RELATED APPLICATIONS

This application is a National Stage of International Application No. PCT/JP2009/061327 filed Jun. 22, 2009, which claims priority from Japanese Patent Application No. 2008-171160 filed Jun. 30, 2008, the contents of all of which are incorporated herein by reference in their entirety.

TECHNICAL FIELD

The present invention relates to an organic thin film transistor and a method for manufacturing the same, a display member using the organic thin film transistor, and a display.

BACKGROUND ART

A plastic substrate of polycarbonate, polyethylene terephthalate and the like has been investigated as a substrate of a flexible display device such as an electronic paper. However, these plastic substrates have the problem of causing slight extension and shrinkage during being heated, and accordingly have been required to have higher heat resistance. On the other hand, an organic thin film transistor has received attention as a transistor to be mounted on the above-described substrate of the device, because of being a thin type and superior in flexibility. Because the plastic substrate has not had sufficient heat resistance as was described above, a process of manufacturing an organic thin film transistor on a substrate can be preferably conducted at as low a temperature as possible.

In the process of manufacturing the organic thin film transistor, generally, a process of film-forming/curing a gate insulating film which is an insulating layer provided between a gate electrode and an organic semiconductor layer has been particularly required to be conducted at a high temperature. Accordingly, in order to conduct the process of manufacturing the organic thin film transistor at a low temperature, it is important to conduct a step of forming the gate insulating film at a low temperature.

A method of anodizing the surface of a gate electrode (see Patent Literature 1), a method of forming the film with a chemical vapor deposition method (see Patent Literature 2) and the like are known as the method for forming the gate insulating film at a low temperature. However, in these methods, the process of forming the gate insulating film is complicated.

For this reason, it is investigated as means for simply forming the gate insulating film at a low temperature to form the film with the means of application or the like. For instance, the following Non Patent Literature 1 describes a method of forming the gate insulating film by spin-coating poly(4-vinylphenol) or poly(melamine-formaldehyde), and curing the compound at 200° C.

CITATION LIST

Patent Literature
  Patent Literature 1: Japanese Patent Application Laid-Open Publication No. 2003-258260
  Patent Literature 2: Japanese Patent Application Laid-Open Publication No. 2004-72049
Non Patent Literature
  Non Patent Literature 1: Hagen Klauk et al., J. Appl. Phys., Vol. 92., No. 9., p. 5259-5263 (2002)

SUMMARY OF INVENTION

Technical Problem

In the case of the above-described method described in Non Patent Literature 1, it has been necessary for forming the gate insulating film to cure the material at a high temperature. However, there are many cases in which it is not possible to sufficiently suppress the expansion and contraction of a plastic substrate due to heat at such a temperature necessary for curing, and for instance, when producing a display device having fine pixels, it becomes impossible to neglect the influence. Accordingly, in recent years, it has been demanded to be capable of forming the gate insulating film at a lower temperature.

The present invention is designed with respect to such circumstances, and an object is to provide an organic thin film transistor of which the gate insulating film can be formed at a low temperature, and a method for manufacturing the same. Another object of the present invention is to provide a display member using the organic thin film transistor and a display.

Solution to Problem

In order to achieve the above-described objects, the organic thin film transistor according to the present invention includes a source electrode, a drain electrode, an organic semiconductor layer which becomes a current path between the source electrode and the drain electrode, a gate electrode which controls an electric current passing through the current path, and an insulating layer which insulates the organic semiconductor layer from the gate electrode, wherein the insulating layer is formed of a cured substance of a composition containing a first compound having, in the molecule, two or more groups (hereinafter referred to as "dissociable groups") that produce a functional group (hereinafter referred to as "reactive functional group") which reacts with an active hydrogen group by electromagnetic radiations or heat, and a second compound having two or more active hydrogen groups in the molecule, where at least one of the first compound and the second compound is a polymer compound.

The above-described organic thin film transistor according to the present invention has an insulating layer formed from a cured substance of the above-described composition. In these compositions, the first compound produces a reactive functional group from a dissociable group by the electromagnetic radiations or heating, subsequently this reactive functional group reacts with the active hydrogen group in the second compound, and a curing reaction proceeds. Here, the first compound can easily produce the reactive functional group by the electromagnetic radiations or heat, and thus produced reactive functional group can also easily react with the active hydrogen group in the second compound. Accordingly, in order to cure the above-described composition, the composition may be irradiated with the electromagnetic radiations or be heated at a comparatively low temperature, and does not need to be heated at such a high temperature as in a conventional method. Accordingly, the above-described organic thin film transistor according to the present invention becomes a product in which an insulating layer (gate insulating film) can be adequately formed even at a low temperature.

In addition, the insulating layer formed of the cured substance of the above-described composition not only can be formed at a low temperature, but also can show superior characteristics, such as rarely causing a leakage current, hardly causing breakdown even when a high voltage is applied thereto, and showing a stable history (hysteresis) of the change in an electric current with respect to the change in voltage and the like, when being used as the gate insulating film of the organic thin film transistor. Accordingly, the organic thin film transistor of the present invention including such an insulating layer can show superior transistor characteristics, and besides, can acquire high durability and reliability.

In the above-described organic thin film transistor of the present invention, a group (dissociable group) that produces the functional group which reacts with an active hydrogen group by electromagnetic radiations or heat preferably includes a blocked isocyanato group or a blocked isothiocyanato group. These blocked groups can easily produce an isocyanato group or an isothiocyanato group which are reactive functional groups, by the electromagnetic radiations or heat applied thereto, and accordingly can form the insulating layer at a lower temperature.

Such a blocked isocyanato group or a blocked isothiocyanato group preferably includes a group represented by the following formula (1a) or a group represented by the following formula (1b):

[Chemical Formula 1]

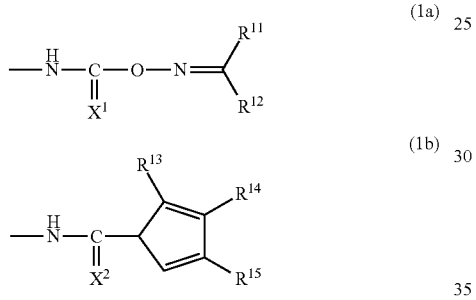

wherein $X^1$ and $X^2$ each independently represent an oxygen atom or a sulfur atom, and $R^{11}$, $R^{12}$, $R^{13}$, $R^{14}$ and $R^{15}$ each independently represent a hydrogen atom or a monovalent organic group having 1 to 20 carbon atoms.

More specifically, the above-described first compound preferably includes a polymer compound having: at least one structural unit selected from the group consisting of a structural unit represented by the following formula (2a) and a structural unit represented by the following formula (2b); and at least one structural unit selected from the group consisting of a structural unit represented by the following formula (2c), a structural unit represented by the following formula (2d) and a structural unit represented by the following formula (2e):

[Chemical Formula 2]

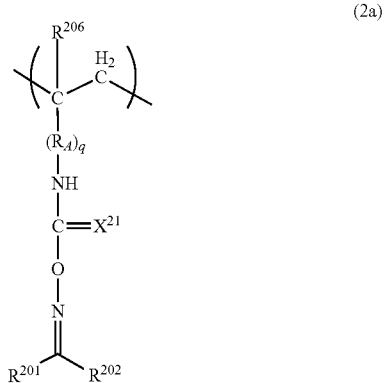

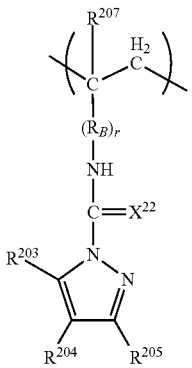

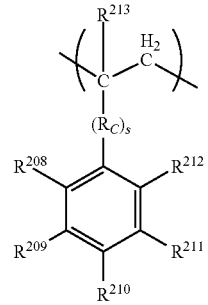

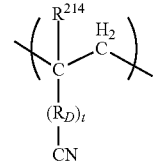

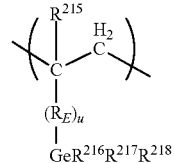

wherein $X^{21}$ and $X^{22}$ each independently represent an oxygen atom or a sulfur atom, $R^{201}$, $R^{202}$, $R^{203}$, $R^{204}$, $R^{205}$, $R^{206}$, $R^{207}$, $R^{208}$, $R^{209}$, $R^{210}$, $R^{211}$, $R^{212}$, $R^{213}$, $R^{214}$, $R^{215}$, $R^{216}$, $R^{217}$ and $R^{218}$ each independently represent a hydrogen atom or a monovalent organic group having 1 to 20 carbon atoms, $R_A$, $R_B$, $R_C$, $R_D$ and $R_E$ each independently represent a divalent organic group having 1 to 20 carbon atoms, and q, r, s, t and u are each independently an integer of 0 to 20.

The present invention also provides a method for manufacturing an organic thin film transistor of the present invention having the above-described structure. Specifically, the method for manufacturing the organic thin film transistor of the present invention is a method for manufacturing the organic thin film transistor including a source electrode, a drain electrode, an organic semiconductor layer which becomes a current path between the source electrode and the drain electrode, a gate electrode which controls an electric current passing through the current path, and an insulating layer which insulates the organic semiconductor layer from the gate electrode, wherein the insulating layer is formed on a face to have the insulating layer formed thereon, by applying a composition containing a first compound having, in the molecule, two or more groups that produce a functional group which reacts with an active hydrogen group by electromagnetic radiations or heat, and a second compound having two or more active hydrogen groups in the molecule, where at least one of the first compound and the second compound is a polymer compound, and curing the composition.

Thus, in the method for manufacturing the organic thin film transistor of the present invention, the insulating layer is formed by applying the above-described composition and then curing the composition, and accordingly can be simply formed at a low temperature.

The present invention further provides a display member using the above-described organic thin film transistor of the present invention, and a display comprising the display member. These display member and display employ the above-described organic thin film transistor of the present invention, which can be formed at a low temperature, accordingly extremely suppresses the deformation and the like of a plastic substrate, and is easily formed to be a display having fine pixels and the like, for instance.

Advantageous Effects of Invention

The present invention can provide an organic thin film transistor of which the gate insulating film can be formed at a low temperature, and a method for manufacturing the same. In a preferred embodiment, thus obtained organic thin film transistor is superior in a threshold voltage, an ON/OFF ratio and hysteresis. The present invention can also provide a display having fine pixels and its display member by using such an organic thin film transistor.

DESCRIPTION OF EMBODIMENTS

Figure 1:
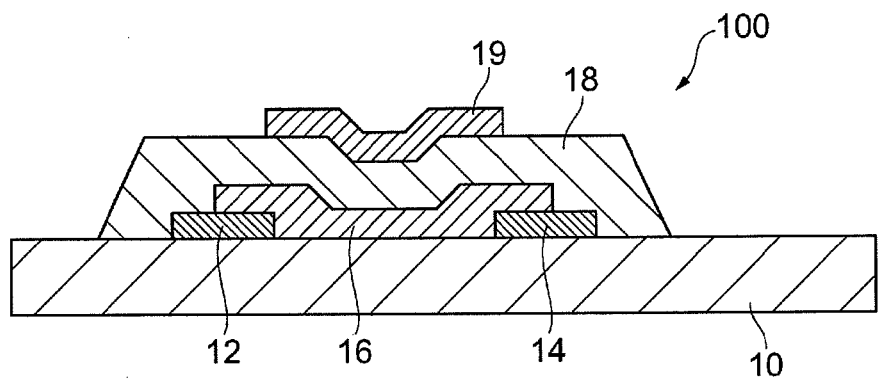
FIG. 1 is a view schematically illustrating a sectional structure of an organic thin film transistor according to a first embodiment.

Preferred embodiments according to the present invention will be described below with reference to the drawings. For information, in the description of the drawings, the same reference numerals will be put on the same elements and overlapping descriptions will be omitted.

[Organic Thin Film Transistor]

Figure 2:
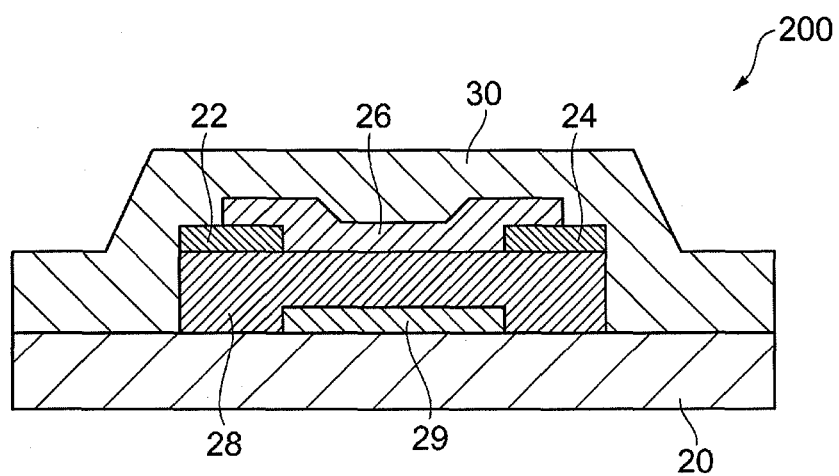
FIG. 2 is a view schematically illustrating a sectional structure of an organic thin film transistor according to a second embodiment.

FIG. 1 is a view schematically illustrating a sectional structure of an organic thin film transistor (hereinafter referred to as merely "transistor") according to a first embodiment, and FIG. 2 is a view schematically illustrating a sectional structure of a transistor according to a second embodiment. The transistor of the first embodiment illustrated in FIG. 1 is a so-called top gate type transistor, and the transistor of the second embodiment illustrated in FIG. 2 is a so-called bottom gate type transistor, but the transistor of the present invention is not necessarily limited to these forms.

As is illustrated in FIG. 1, a transistor 100 of the first embodiment has a source electrode 12, a drain electrode 14, an organic semiconductor layer 16, a gate insulating layer (insulating layer) 18, and a gate electrode 19 provided on a substrate 10 in this order.

In this transistor 100, the source electrode 12 and the drain electrode 14 are provided on the substrate 10 so as to be separated from each other by a predetermined space. The organic semiconductor layer 16 is formed on the substrate 10 so as to cover at least one part of each of the source electrode 12 and the drain electrode 14. The organic semiconductor layer 16 is brought in contact with both the source electrode 12 and the drain electrode 14, and thereby becomes a current path between these electrodes.

In addition, the gate insulating layer 18 is provided so as to cover all of the source electrode 12, the drain electrode 14 and the organic semiconductor layer 16 which have been formed in the lower part. The gate electrode 19 is further provided on this gate insulating layer 18. Thus, the gate insulating layer 18 is formed between the organic semiconductor layer 16 and the gate electrode 19, and thereby insulates the organic semiconductor layer 16 from the gate electrode 19.

On the other hand, as is illustrated in FIG. 2, a transistor 200 of the second embodiment has a gate electrode 29, a gate insulating layer 28, a source electrode 22 and a drain electrode 24, an organic semiconductor layer 26 and a topcoat 30 provided on a substrate 20 in this order.

In this transistor 200, the gate electrode 29 is directly provided on the substrate 20, and the gate insulating layer 28 is formed so as to cover this gate electrode 29. The source electrode 22 and the drain electrode 24 are provided on the gate insulating layer 28 so as to be separated from each other by a predetermined space. The organic semiconductor layer 26 is provided on the gate insulating layer 28 so as to cover at least one part of each of the source electrode 22 and the drain electrode 24.

The organic semiconductor layer 26 is brought in contact with both the source electrode 22 and the drain electrode 24, and thereby becomes a current path between these electrodes. In addition, the organic semiconductor layer 26 and the gate electrode 29 are insulated from each other, because the gate insulating layer 28 is formed therebetween.

In the transistor 200, a topcoat 30 is provided on the substrate 20 so as to cover all of the above-described element structure. Thereby, the organic semiconductor layer 26 is protected which easily deteriorates by being brought in contact with the element structure, particularly, the outer part.

In the above-described transistors 100 and 200, firstly, the substrates 10 and 20 are formed of a well-known substrate such as a glass substrate and a plastic substrate. However, because the transistor of the present invention can be formed at a low temperature as will be described later, a plastic substrate which ordinarily easily causes expansion, contraction and the like by heat can be adequately applied to the substrates 10 and 20. By applying the plastic substrate to the substrate, the weight of the transistors 100 and 200 can be easily reduced and the transistors can become flexible.

The gate electrodes 19 and 29 are formed of an electroconductive material. Examples of the electroconductive material can include: a metal such as aluminum, gold, platinum, silver, copper, chromium, nickel and titanium; an electroconductive oxide such as ITO; and an electroconductive polymer such as a mixed polymer of poly(3,4-ethylene dioxythiophene) and polystyrene sulfonate. In addition, an electroconductive material in which fine particles of metal, carbon black and fine powders of graphite are dispersed in a binder also can be applied to the electroconductive material. Furthermore, an electrode formed from the same electroconductive material as the gate electrodes 19 and 29 can be applied to the source electrodes 12 and 22 and the drain electrodes 14 and 24 as well.

A substance formed of a low-molecular organic semiconductor material and a polymer organic semiconductor material can be applied to the organic semiconductor layers 16 and 26. The low-molecular organic semiconductor material includes pentacene, for instance. In addition, the polymer organic semiconductor material includes poly-3-hexylthiophene (P3HT) and fluorene dithiophene (F8T2), for instance. The organic semiconductor layers 16 and 26 are formed of an organic material which can function as a semiconductor.

The gate insulating layers 18 and 28 (insulating layer) in the transistors 100 and 200 are formed of a cured substance of a composition containing a first compound having, in the molecule, two or more groups (dissociable groups) that produce a functional group (reactive functional group) which reacts with an active hydrogen group by electromagnetic radiations or heat, and a second compound having two or more active hydrogen groups in the molecule, where at least one of the first compound and the second compound is a polymer compound.

The composition constituting the gate insulating layers 18 and 28 (hereinafter referred to as "insulating composition") and its cured substance will be described in detail below.

In the insulating composition, at least one of a first compound and a second compound is a polymer compound. In other words, a combination in the insulating composition includes a case in which both the first compound and the second compound are polymer compounds, and a case in which any one of the first and the second compounds is a polymer compound, and the other is a low-molecular compound. In the present specification, a "polymer compound" means a compound having a structure in which the same structural unit repeats several times in the molecule, and includes a so-called dimer as well. On the other hand, a "low-molecular compound" means a compound in which the same structural unit does not repeat in the molecule.

Firstly, the first compound will be described below.

In the first compound, a dissociable group includes a blocked isocyanato group (hereinafter referred to as "block isocyanato group") and a blocked isothiocyanato group (hereinafter referred to as "block isothiocyanato group").

The dissociable group is preferably a block isocyanato group or a block isothiocyanato group. The block isocyanato group or the block isothiocyanato group produces an isocyanato group or isothiocyanato group which is a functional group that becomes reactive by heat, respectively.

The block isocyanato group or the block isothiocyanato group is an isocyanato group or an isothiocyanato group which is blocked by a blocking agent, respectively. This blocking agent is a compound which reacts with the isocyanato group or the isothiocyanato group and consequently can form a group which protects these groups, and includes, for instance, a compound having one active hydrogen group which can react with the isocyanato group or the isothiocyanato group. The blocking agent is preferably an agent which dissociates (deblocked) by being heated to a temperature of 170° C. or lower after having been blocked, and produces the isocyanato group or the isothiocyanato group again, in particular.

Such blocking agents include compounds such as an alcohol-based compound, a phenol-based compound, an active-methylene-based compound, a mercaptan-based compound, an acid-amide-based compound, an acid-imide-based compound, an imidazole-based compound, a urea-based compound, an oxime-based compound, an amine-based compound, an imide-based compound, a pyridine-based compound, and a pyrazole-based compound, for instance.

The blocking agents can be used singly or in combination of two or more thereof. Among them, the oxime-based compound or the pyrazole-based compound is preferable.

More specifically, in the blocking agents, the alcohol-based compound includes methanol, ethanol, propanol, butanol, 2-ethylhexanol, methyl cellosolve, butyl cellosolve, methyl carbitol, benzyl alcohol and cyclohexanol, and the phenol-based compound includes phenol, cresol, ethylphenol, butylphenol, nonylphenol, dinonylphenol, styrenated phenol and a hydroxybenzoate. The active-methylene-based compound includes dimethyl malonate, diethyl malonate, methyl acetoacetate, ethyl acetoacetate and acetylacetone, and the mercaptan-based compound includes butyl mercaptan and dodecyl mercaptan.

The acid-amide-based compound which is the blocking agent includes acetanilide, acetic acid amide, ε-caprolactam, δ-valerolactam and γ-butyrolactam, and the acid-imide-based compound includes succinic acid imide and maleic acid imide. The imidazole-based compound includes imidazole and 2-methylimidazole, and the urea-based compound includes urea, thiourea and ethylene urea. The amine-based compound includes diphenyl amine, aniline and carbazole, and the imine-based compound includes ethyleneimine and polyethyleneimine. A bisulfite includes sodium bisulfite, and the pyridine-based compound includes 2-hydroxypyridine and 2-hydroxyquinoline. Furthermore, the oxime-based compound includes formaldoxime, acetaldoxime, acetoxime, methyl ethyl ketoxime and cyclohexanone oxime, and the pyrazole-based compound includes 3,5-dimethylpyrazole and 3,5-diethylpyrazole.

On the other hand, the blocking agent which is deblocked by irradiation with electromagnetic radiations includes an ortho-nitrobenzyl group and an α,α-dimethyl-3,5-dimethoxybenzyl group.

The above-described block isocyanato group or block isothiocyanato group preferably includes a group represented by the following formula (1a) or (1b):

[Chemical Formula 3]

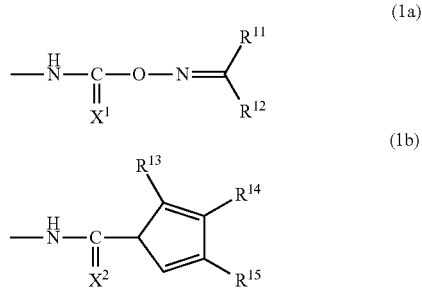

wherein $X^1$ and $X^2$ each independently represent an oxygen atom or a sulfur atom, and $R^{11}$, $R^{12}$, $R^{13}$, $R^{14}$ and $R^{15}$ each independently represent a hydrogen atom or a monovalent organic group having 1 to 20 carbon atoms.

Here, in these block isocyanato group or block isothiocyanato group, the monovalent organic group which is represented by $R^{11}$ to $R^{15}$ and has 1 to 20 carbon atoms may be any straight-chain, branched or cyclic group, and may be any one of a saturated group and an unsaturated group.

The monovalent organic group having 1 to 20 carbon atoms includes a straight-chain hydrocarbon group having 1 to 20 carbon atoms, a branched hydrocarbon group having 3 to 20 carbon atoms, a cyclic hydrocarbon group having 3 to 20 carbon atoms and an aromatic hydrocarbon group having 6 to 20 carbon atoms, for instance. The monovalent organic group is preferably any one of a straight-chain hydrocarbon group having 1 to 6 carbon atoms, a branched hydrocarbon group having 3 to 6 carbon atoms, a cyclic hydrocarbon group having 3 to 6 carbon atoms or an aromatic hydrocarbon group having 6 to 20 carbon atoms.

In addition, these straight-chain hydrocarbon group having 1 to 20 carbon atoms, branched hydrocarbon group having 3 to 20 carbon atoms and cyclic hydrocarbon group having 3 to 20 carbon atoms may also have fluorine atoms with which some hydrogen atoms thereof are substituted. The aromatic hydrocarbon group having 6 to 20 carbon atoms may also be substituted with an alkyl group, a halogen atom and the like.

The monovalent organic groups having 1 to 20 carbon atoms include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethyl phenyl group, a trimethyl phenyl group, an ethyl phenyl group, a diethyl phenyl group, a triethyl phenyl group, a propyl phenyl group, a butyl phenyl group, a methyl naphthyl group, a dimethyl naphthyl group, a trimethyl naphthyl group, a vinyl naphthyl group, an ethenyl naphthyl group, a methyl anthryl group, an ethyl anthryl group, a pentafluorophenyl group, a trifluoromethyl phenyl group, a chlorophenyl group and a bromophenyl group.

The above-described block isocyanato group includes O-(methylidene amino)carboxyamino group, O-(1-ethylidene amino)carboxyamino group, O-(1-methyl ethylidene amino)carboxyamino group, O-[1-methyl propylidene amino]carboxyamino group, 1-(3,5-dimethyl pyrazolyl)carbonyl amino group, 1-(3-ethyl-5-methyl pyrazolyl)carbonyl amino group, 1-(3,5-diethyl pyrazolyl)carbonyl amino group, 1-(3-propyl-5-methyl pyrazolyl)carbonyl amino group and 1-(3-ethyl-5-propyl pyrazolyl)carbonyl amino group.

The block isothiocyanato group includes O-(methylidene amino)thiocarboxyamino group, O-(1-ethylidene amino)thiocarboxyamino group, O-(1-methyl ethylidene amino)thiocarboxyamino group, O-[1-methyl propylidene amino] thiocarboxyamino group, 1-(3,5-dimethyl pyrazolyl) thiocarbonyl amino group, 1-(3-ethyl-5-methyl pyrazolyl) thiocarbonyl amino group, 1-(3,5-diethyl pyrazolyl) thiocarbonyl amino group, 1-(3-propyl-5-methyl pyrazolyl) thiocarbonyl amino group and 1-(3-ethyl-5-propyl pyrazolyl) thiocarbonyl amino group.

The first compound is a polymer compound or a low-molecular compound having two or more above-described dissociable groups.

Firstly, the case in which the first compound is a polymer compound will be described below.

When the first compound is the polymer compound, the dissociable group may be directly bonded to a main chain constituting the polymer compound, and may also be bonded to the main chain through a predetermined group. The dissociable group may also be contained in a structural unit constituting the polymer compound, but in this case, the dissociable group may be contained in each of the structural units or may also be contained in only some of the structural units. From the viewpoint of moderately curing the insulating composition and imparting adequate flexibility to the gate insulating layers 18 and 28, the dissociable group is preferably contained in only some of the structural units. Furthermore, the dissociable group may also be bonded to only a terminal end of the polymer compound.

The first compound formed of the polymer compound can be obtained, for instance, by solely polymerizing a monomer compound (monomer) having the dissociable group and an unsaturated bond (double bond, for instance) in the molecule or copolymerizing the monomer compound with another copolymerizable compound (copolymerization monomer) to form a polymer. In addition, the first compound can also be obtained by using a compound having a reactive functional group in place of the dissociable group as the above-described monomer, polymerizing the compound to form a polymer, and then changing the reactive functional group in the obtained polymer to the dissociable group. A photopolymerization initiator or a thermal polymerization initiator may also be applied for these polymerization reactions.

For instance, when the dissociable group is the block isocyanato group or the block isothiocyanato group, the first compound can be obtained in the following way. Specifically, the first compound can be obtained by polymerizing the monomer having the isocyanato group or the isothiocyanato group and the unsaturated bond in the molecule solely or together with another copolymerization polymer to form a polymer, and then making the block isocyanato group or the block isothiocyanato group react with the above-described blocking agent to convert the block isocyanato group or the block isothiocyanato group into the block isocyanato group or the block isothiocyanato group.

The monomer having the isocyanato group or the isothiocyanato group and the unsaturated bond in the molecular includes 2-acryloyl oxyethyl isocyanate, 2-methacryloyl oxyethyl isocyanate, 2-(2'-methacryloyl oxyethyl)oxyethyl isocyanate, 2-acryloyl oxyethyl isothiocyanate, 2-methacryloyl oxyethyl isothiocyanate and 2-(2'-methacryloyl oxyethyl)oxyethyl isothiocyanate.

The first compound can be obtained also by polymerizing the monomer having the block isocyanato group or the block isothiocyanato group and the unsaturated bond in the molecule solely or together with another copolymerization polymer to form a polymer, from the beginning The monomer having the block isocyanato group and the unsaturated bond in the molecule includes, for instance, 2-[O-[1'-methyl propylidene amino]carboxyamino]ethyl-methacrylate and 2-[N-[1',3'-dimethyl pyrazolyl]carboxyamino]ethyl-methacrylate.

The photopolymerization initiator which is used for a polymerization reaction includes, for instance: a carbonyl compound such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethyl amino) benzophenone, benzophenone, methyl(o-benzoyl)benzoate, 1-phenyl-1,2-propane dione-2-(o-ethoxycarbonyl)oxime, 1-phenyl-1,2-propane dione-2-(o-benzoyl)oxime, benzoin, benzoin methyl ether, benzoin ethyl ether, benzoin isopropyl ether, benzoin isobutyl ether, benzoin octyl ether, benzyl, benzyl dimethyl ketal, benzyl diethyl ketal and diacetyl; anthraquinone or a thioxanthone derivative such as methylanthraquinone, chloroanthraquinone, chlorothioxanthone, 2-methyl thioxanthone and 2-isopropyl thioxanthone; and a sulfur compound such as diphenyl disulfide and dithiocarbamate.

The thermal polymerization initiator can function as an initiator of a radical polymerization. The thermal polymerization initiator includes for instance: an azo-based compound such as 2,2'-azobisisobutyronitrile, 2,2'-azobisisovaleronitrile, 2,2'-azobis(2,4-dimethyl valeronitrile), 4,4'-azobis (4-cyanovaleric acid), 1,1'-azobis(cyclohexane carbonitrile), 2,2'-azobis(2-methylpropane) and 2,2'-azobis(2-methyl propionamidine)2hydrochloride; ketone peroxides such as methyl ethyl ketone peroxide, methyl isobutyl ketone peroxide, cyclohexanone peroxide and acetylacetone peroxide; diacyl peroxides such as isobutyl peroxide, benzoyl peroxide, 2,4-dichlorobenzoyl peroxide, o-methyl benzoyl peroxide, lauroyl peroxide and p-chlorobenzoyl peroxide; hydroperoxides such as 2,4,4-trimethyl pentyl-2-hydroperoxide, diisopropyl benzene peroxide, cumene hydroperoxide and t-butyl peroxide; dialkyl peroxides such as dicumyl peroxide, t-butyl cumyl peroxide, di-t-butyl peroxide and tris(t-butyl peroxy) triazine; peroxyketals such as 1,1-di-t-butyl peroxycyclohexane and 2,2-di(t-butyl peroxy)butane; alkyl peresters such as t-butyl peroxypivalate, t-butyl peroxy-2-ethyl hexanoate, t-butyl peroxyisobutyrate, di-t-butyl peroxyhexahydroterephthalate, di-t-butyl peroxyazelate, t-butyl peroxy-3,5,5-trimethyl hexanoate, t-butyl peroxyacetate, t-butyl peroxybenzoate and di-t-butyl peroxytrimethyl adipate; and percarbonates such as diisopropyl peroxydicarbonate, di-sec-butyl peroxydicarbonate and t-butyl peroxyisopropyl carbonate.

The copolymerization monomer which is copolymerized with the monomer having the above-described dissociable group or the reactive functional group includes, for instance, a (meth)acrylic ester and a derivative thereof, styrene and a derivative thereof, vinyl acetate and a derivative thereof, (meth)acrylonitrile and a derivative thereof, a vinyl ester of an organic carboxylic acid and a derivative thereof, an allyl ester of an organic carboxylic acid and a derivative thereof, a dialkyl ester of fumaric acid and a derivative thereof, a dialkyl ester of maleic acid and a derivative thereof, a dialkyl ester of itaconic acid and a derivative thereof, an N-vinyl amide derivative of an organic carboxylic acid, maleimide and a derivative thereof, a terminal-unsaturated hydrocarbon and a derivative thereof, and an organic germanium derivative. In the present specification, "(meth)acryl" is a collective term of acrylic and methacrylic, and represents either or both of these substances.

Among the copolymerization monomers, a monofunctional (meth)acrylate and a multifunctional (meth)acrylate can be applied to (meth)acrylic esters and a derivative thereof. The amount of the multiunctional (meth)acrylate to be used is occasionally restricted according to the properties of a target polymer.

The (meth)acrylic esters and derivatives thereof include, for instance, methyl(meth)acrylate, ethyl(meth)acrylate, n-propyl(meth)acrylate, isopropyl(meth)acrylate, n-butyl (meth)acrylate, isobutyl(meth)acrylate, sec-butyl(meth) acrylate, hexyl(meth)acrylate, octyl(meth)acrylate, 2-ethylhexyl(meth)acrylate, decyl(meth)acrylate, isobornyl(meth) acrylate, cyclohexyl(meth)acrylate, phenyl(meth)acrylate, benzyl(meth)acrylate, 2-hydroxyethyl(meth)acrylate, 2-hydroxypropyl(meth)acrylate, 3-hydroxypropyl(meth)acrylate, 2-hydroxybutyl(meth)acrylate, 2-hydroxyphenyl ethyl (meth)acrylate, ethylene glycol di(meth)acrylate, propylene glycol di(meth)acrylate, 1,4-butanediol di(meth)acrylate, diethylene glycol di(meth)acrylate, triethylene glycol di(meth)acrylate, trimethylolpropane di(meth)acrylate, trimethylolpropane tri(meth)acrylate, pentaerythritol penta (meth)acrylate, N,N-dimethyl(meth)acrylamide, N,N-diethyl(meth)acrylamide and N-acryloyl morpholine.

In addition, the styrene and a derivative thereof include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethyl styrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, α-methylstyrene, o-isopropenyl toluene, m-isopropenyl toluene, p-isopropenyl toluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinyl biphenyl, diisopropylbenzene and 4-amino styrene.

The (meth)acrylonitrile and a derivative thereof include acrylonitrile and methacrylonitrile. The vinyl ester of an organic carboxylic acid and a derivative thereof include vinyl acetate, vinyl propionate, vinyl butyrate, vinyl benzoate and divinyl adipate. The allyl ester of an organic carboxylic acid and a derivative thereof include allyl acetate, allyl benzoate, diaryl adipate, diaryl terephthalate, diallyl isophthalate and diallyl phthalate.

The dialkyl ester of fumaric acid and a derivative thereof include dimethyl fumarate, diethyl fumarate, diisopropyl fumarate, di-sec-butyl fumarate, diisobutyl fumarate, di-n-butyl fumarate, di-2-ethylhexyl fumarate and dibenzyl fumarate. The dialkyl ester of maleic acid and a derivative thereof include dimethyl maleate, diethyl maleate, diisopropyl maleate, di-sec-butyl maleate, diisobutyl maleate, di-n-butyl maleate, di-2-ethylhexyl maleate and dibenzyl maleate.

The dialkyl ester of itaconic acid and a derivative thereof include dimethyl itaconate, diethyl itaconate, diisopropyl itaconate, di-sec-butyl itaconate, di-isobutyl itaconate, di-n-butyl itaconate, di-2-ethylhexyl itaconate and dibenzyl itaconate. The N-vinyl amide derivative of an organic carboxylic acid includes N-methyl-N-vinyl acetamide. The maleimide and a derivative thereof include N-phenyl maleimide and N-cyclohexyl maleimide.

The terminal-unsaturated hydrocarbon and a derivative thereof include 1-butene, 1-pentene, 1-hexene, 1-octene, vinylcyclohexane, vinyl chloride and allyl alcohol. The organic germanium derivative includes allyl trimethyl germanium, allyl triethyl germanium, allyl tributyl germanium, trimethyl vinyl germanium and triethyl vinyl germanium.

Among these copolymerization monomers, an alkyl(meth) acrylate, styrene, (meth)acrylonitrile or allyl trimethyl germanium is preferable, and these compounds may be appropriately combined to be applied.

When the first compound is formed by copolymerizing the monomer having the dissociable group or the reactive functional group with the copolymerization monomer, the monomer having the dissociable group or the reactive functional group is preferably 5 mol % or more and 60 mol % or less in the total amount of the monomer to be supplied to polymerization, and more preferably is 10 mol % or more and 50 mol % or less. By adjusting the percentage so as to satisfy such a copolymerization ratio, the first compound results in moderately containing the dissociable group, and the insulating composition results in being adequately cured.

Thus obtained first compound is preferably a polymer compound, for instance, including at least one structural unit selected from the group consisting of a structural unit represented by the following formula (2a) and a structural unit represented by the following formula (2b), and at least one structural unit selected from the group consisting of a structural unit represented by the following formula (2c), a structural unit represented by the following formula (2d) and a structural unit represented by the following formula (2e):

[Chemical Formula 4]

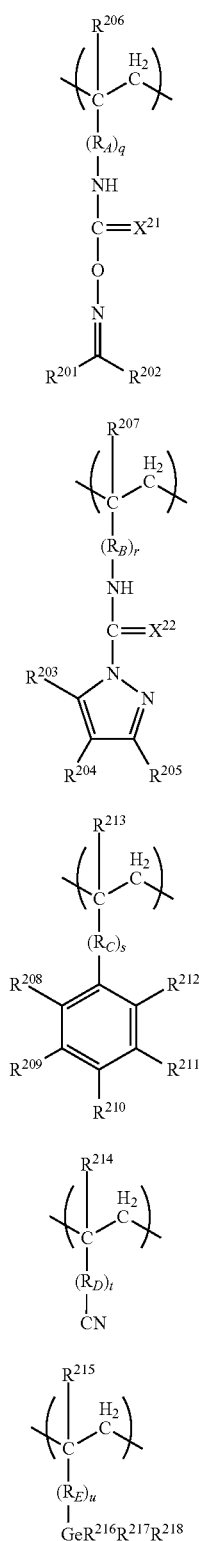

(2a)

(2b)

(2c)

(2d)

(2e)

wherein $X^{21}$ and $X^{22}$ each independently represent an oxygen atom or a sulfur atom, $R^{201}$, $R^{202}$, $R^{203}$, $R^{204}$, $R^{205}$, $R^{206}$, $R^{207}$, $R^{208}$, $R^{209}$, $R^{210}$, $R^{211}$, $R^{212}$, $R^{213}$, $R^{214}$, $R^{215}$, $R^{216}$, $R^{217}$ and $R^{218}$ each independently represent a hydrogen atom or a monovalent organic group having 1 to 20 carbon atoms, $R_A$, $R_B$, $R_C$, $R_D$ and $R_E$ each independently represent a divalent organic group having 1 to 20 carbon atoms, and q, r, s, t and u are each independently an integer of 0 to 20.

This polymer compound may have a plurality of structural units out of a structural unit represented by the above formula (2a) and a structural unit represented by the above formula (2b), and a plurality of structural units out of a structural unit represented by the above formula (2c), a structural unit represented by the above formula (2d) and a structural unit represented by the above formula (2e), in combination.

Here, the monovalent organic groups having 1 to 20 carbon atoms in the above formulae (2a) to (2e) include the same organic groups as those having 1 to 20 carbon atoms shown in the block isocyanato group or the block isothiocyanato group represented by the above formula (1a) or (1b). In addition, the divalent organic groups having 1 to 20 carbon atoms include divalent groups in which one hydrogen atom out of hydrogen atoms in those monovalent organic groups becomes a coupling site with another structure.

When the first compound is a polymer compound, the first compound more specifically includes poly(styrene-co-[2-[O-(1'-methyl propylidene amino)carboxyamino]ethyl-methacrylate]), poly(styrene-co-[2-[1'-(3',5'-dimethyl pyrazolyl) carbonyl amino]ethyl-methacrylate]), poly(styrene-co-acrylonitrile-co-[2-[O-(1'-methyl propylidene amino) carboxyamino]ethyl-methacrylate]), poly(styrene-co-acrylonitrile-co-[2-[1'-(3',5'-dimethyl pyrazolyl)carbonyl amino]ethyl-methacrylate]), poly(styrene-co-acrylonitrile-co-[2-[O-(1'-methyl propylidene amino)carboxyamino] ethyl-methacrylate]-co-allyl trimethyl germanium) and poly (styrene-co-acrylonitrile-co-[2-[1'-(3',5'-dimethyl pyrazolyl) carbonyl amino]ethyl-methacrylate]-co-allyl trimethyl germanium).

The first compound formed of the above-described polymer compound preferably has the weight average molecular weight of 3,000 to 1,000,000 and more preferably of 5,000 to 500,000 in terms of polystyrene. By having such a weight average molecular weight, the first compound acquires an advantage of being capable of forming an insulating layer having adequate flatness and uniformity.

Next, the case will be described below in which the first compound is a low-molecular compound.

The first compound formed of the low-molecular compound is a compound having a structure in which two or more dissociable groups are bonded to a low-molecular (monomer) structure. A form of this low-molecular structure is preferably an alkyl structure and a benzene ring which may have a substituent, for instance.

When the dissociable group is the block isocyanato group or the block isothiocyanato group, the first compound is preferably a compound represented by the following formula (3a) or a compound represented by the following formula (3b):

[Chemical Formula 5]

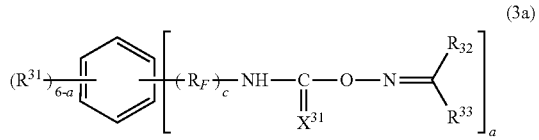

(3a)

-continued

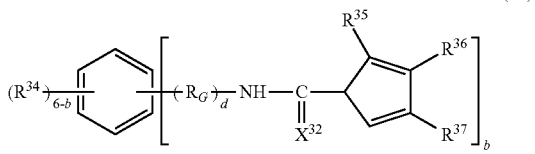
(3b)

wherein $X^{31}$ and $X^{32}$ each independently represent an oxygen atom or a sulfur atom, $R^{31}$, $R^{32}$, $R^{33}$, $R^{34}$, $R^{35}$, $R^{36}$ and $R^{37}$ each independently represent a hydrogen atom or a monovalent organic group having 1 to 20 carbon atoms, $R_F$ and $R_G$ each independently represent a divalent organic group having 1 to 20 carbon atoms, a and b are each independently an integer of 2 to 6, and c and d are each independently an integer of 0 to 20.

Examples of the monovalent organic group or the divalent organic group having 1 to 20 carbon atoms in the above formula (3a) or (3b) can include the same group as the above-described group.

Such a first compound can be obtained by making the above-described blocking agent react with a low-molecular compound having two or more isocyanato groups or isothiocyanato groups to convert the isocyanato group or the isothiocyanato group which is a reactive functional group, into the block isocyanato group or the block isothiocyanato group, for instance. In this reaction, an organic solvent, a catalyst and the like may be appropriately added.

The low-molecular compounds having two or more isocyanato groups or isothiocyanato groups include, for instance, ortho-phenylene diisocyanate, meta-phenylene diisocyanate, para-phenylene diisocyanate, tolylene diisocyanate, tetramethylene diisocyanate and hexamethylene diisocyanate.

Examples of the low-molecular compound having two or more block isocyanato groups or block isothiocyanato groups which can be obtained by the above-described reaction can include the following compounds.

Specifically, the low-molecular compound includes 1,2-di[O-(methylidene amino)carboxyamino]benzene, 1,3-di[O-(methylidene amino)carboxyamino]benzene, 1,4-di[O-(methylidene amino)carboxyamino]benzene, 1,2-di[O-(1'-ethylidene amino)carboxyamino]benzene, 1,3-di[O-(1'-ethylidene amino)carboxyamino]benzene, 1,4-di[O-(1'-ethylidene amino)carboxyamino]benzene, 1,2-di[O-(1'-methyl ethylidene amino)carboxyamino]benzene, 1,3-di[O-(1'-methyl ethylidene amino)carboxyamino]benzene, 1,4-di[O-(1'-methyl ethylidene amino)carboxyamino]benzene, 1,2-di[O-[1'-methyl propylidene amino]carboxyamino]benzene, 1,3-di[O-[1'-methyl propylidene amino]carboxyamino]benzene, 1,4-di[O-[1'-methyl propylidene amino]carboxyamino]benzene, 1,2-di[1'-(3',5'-dimethyl pyrazolyl)carbonyl amino]benzene, 1,3-di[1'(3',5'-dimethyl pyrazolyl)carbonyl amino]benzene, 1,4-di[1'-(3',5'-dimethyl pyrazolyl)carbonyl amino]benzene, 1,2-di[1'-(3'-ethyl-5'-methyl pyrazolyl)carbonyl amino]benzene, 1,3-di[1-(3'-ethyl-5'-methyl pyrazolyl)carbonyl amino]benzene, 1,4-di[1'-(3'-ethyl-5'-methyl pyrazolyl)carbonyl amino]benzene, 1,2-di[1'-(3',5'-diethyl pyrazolyl)carbonyl amino]benzene, 1,3-di[1'-(3',5'-diethyl pyrazolyl)carbonyl amino]benzene, 1,4-di[1'-(3',5'-diethyl pyrazolyl)carbonyl amino]benzene, 1,2-di[1'-(3'-propyl-5'-methyl pyrazolyl)carbonyl amino]benzene, 1,3-di[1'-(3'-propyl-5'-methyl pyrazolyl)carbonyl amino]benzene, 1,4-di[1'-(3'-propyl-5'-methyl pyrazolyl)carbonyl amino]benzene, 1,2-di[1'-(3'-ethyl-5'-propyl pyrazolyl)carbonyl amino]benzene, 1,3-di[1'-(3'-ethyl-5'-propyl pyrazolyl)carbonyl amino]benzene, 1,4-di[1'-(3'-ethyl-5'-propyl pyrazolyl)carbonyl amino]benzene, 1,4-di[O-(methylidene amino)carboxyamino]butane, 1,4-di[O-(1'-methyl ethylidene amino)carboxyamino]butane, 1,6-di[O-(methylidene amino)carboxyamino]hexane, 1,6-di[O-(1'-methyl ethylidene amino)carboxyamino]hexane, 1,2-di[O-(methylidene amino)thiocarboxyamino]benzene, 1,3-di[O-(methylidene amino)thiocarboxyamino]benzene, 1,4-di[O-(methylidene amino)thiocarboxyamino]benzene, 1,2-di[O-(1'-ethylidene amino)thiocarboxyamino]benzene, 1,3-di[O-(1'-ethylidene amino)thiocarboxyamino]benzene, 1,4-di[O-(1'-ethylidene amino)thiocarboxyamino]benzene, 1,2-di[O-(1'-methyl ethylidene amino)thiocarboxyamino]benzene, 1,3-di[O-(1'-methyl ethylidene amino)thiocarboxyamino]benzene, 1,4-di[O-(1'-methyl ethylidene amino)thiocarboxyamino]benzene, 1,2-di[O-[1'-methyl propylidene amino]thiocarboxyamino]benzene, 1,3-di[O-[1'-methyl propylidene amino]thiocarboxyamino]benzene, 1,4-di[O-[1'-methyl propylidene amino]thiocarboxyamino]benzene, 1,2-di[1'-(3',5'-dimethyl pyrazolyl)thiocarbonyl amino]benzene, 1,3-di[1'-(3',5'-dimethyl pyrazolyl)thiocarbonyl amino]benzene, 1,4-di[1'-(3',5'-dimethyl pyrazolyl)thiocarbonyl amino]benzene, 1,2-di[1'-(3'-ethyl-5'-methyl pyrazolyl)thiocarbonyl amino]benzene, 1,3-di[1'-(3'-ethyl-5'-methyl pyrazolyl)thiocarbonyl amino]benzene, 1,4-di[1'(3'-ethyl-5'-methyl pyrazolyl)thiocarbonyl amino]benzene, 1,2-di[1'-(3',5'-diethyl pyrazolyl)thiocarbonyl amino]benzene, 1,3-di[1'-(3',5'-diethyl pyrazolyl)thiocarbonyl amino]benzene, 1,4-di[1'-(3',5'-diethyl pyrazolyl)thiocarbonyl amino]benzene, 1,2-di[1'-(3'-propyl-5'-methyl pyrazolyl)thiocarbonyl amino]benzene, 1,3-di[1'-(3'-propyl-5'-methyl pyrazolyl)thiocarbonyl amino]benzene, 1,4-di[1'-(3'-propyl-5'-methyl pyrazolyl)thiocarbonyl amino]benzene, 1,2-di[1'-(3'-ethyl-5'-propyl pyrazolyl)thiocarbonyl amino]benzene, 1,3-di[1'-(3'-ethyl-5'-propyl pyrazolyl)thiocarbonyl amino]benzene, 1,4-di[1'-(3'-ethyl-5'-propyl pyrazolyl)thiocarbonyl amino]benzene, 1,4-di[O-(methylidene amino)thiocarboxyamino]butane, 1,4-di[O-(1'-methyl ethylidene amino)thiocarboxyamino]butane, 1,6-di[O-(methylidene amino)thiocarboxyamino]hexane and 1,6-di[O-(1'-methyl ethylidene amino)thiocarboxyamino]hexane.

In addition, a low-molecular compound having two or more block isocyanato groups or block isothiocyanato groups which are mainly deblocked not by heat but by electromagnetic radiations includes 1,2-di(ortho-nitrobenzyl carbonyl amino)benzene, 1,3-di(ortho-nitrobenzyl carbonyl amino)benzene, 1,4-di(ortho-nitrobenzyl carbonyl amino)benzene, 1,2-bis[α-(α,α-dimethyl-3,5-dimethoxybenzyl)carbonylamino]benzene, 1,3-bis[α-(α,α-dimethyl-3,5-dimethoxybenzyl)carbonylamino]benzene, 1,4-bis[α-(α,α-dimethyl-3,5-dimethoxybenzyl)carbonylamino]benzene, 2-(ortho-nitrobenzyl carbonyl amino)ethyl-methacrylate and 2-[α-(α,α-dimethyl-3,5-dimethoxybenzyl)carbonylamino]ethyl-methacrylate.

Next, a second compound will be described below.

The second compound is a polymer compound or a low-molecular compound having two or more active hydrogen groups in the molecule. In this second compound, the active hydrogen group includes an amino group, a hydroxyl group and a mercapto group. Among them, the active hydrogen group is preferably a phenolic hydroxyl group and an aromatic amino group which can adequately react with the above-described reactive functional group (particularly, an isocyanato group or an isothiocyanato group).

When the second compound is a polymer compound, the active hydrogen group may be directly bonded to a main chain constituting the polymer compound, and may also be bonded to the main chain through a predetermined group. In addition, the active hydrogen group may also be contained in the structural unit constituting the polymer compound, and in this case, the active hydrogen group may be contained in each of the structural units or may also be contained in only some of the structural units. Furthermore, the active hydrogen group may also be bonded to only a terminal end of the polymer compound.

The second compound formed of the polymer compound can be obtained, for instance, by solely polymerizing a monomer compound (monomer) having the active hydrogen group and an unsaturated bond (double bond, for instance) in the molecule or copolymerizing the monomer compound with another copolymerizable compound to form a polymer. A photopolymerization initiator or a thermal polymerization initiator may also be applied for these polymerization reactions. For information, the copolymerization monomer, the photopolymerization initiator and the thermal polymerization initiator similar to those to be used when the first compound formed of the above-described polymer compound is formed can be applied.

The monomer having the active hydrogen group and the unsaturated bond in the molecule includes, for instance, aminostyrene, hydroxystyrene, vinyl benzyl alcohol, aminoethyl methacrylate, and ethylene glycol monovinyl ether.

The second compound formed of the polymer compound is also preferably a novolak resin obtained by condensing a phenolic compound with formaldehyde in the presence of an acid catalyst.

When the second compound is a polymer compound, its weight average molecular weight is preferably 1,000 to 1,000,000, and more preferably is 3,000 to 500,000 in terms of polystyrene. Thereby, an effect of making the flatness and uniformity of an insulating layer adequate can be obtained.

On the other hand, when the second compound is a low-molecular compound, such a second compound is a compound having a structure in which two or more active hydrogen groups are bonded to a low-molecular (monomer) structure. This low-molecular structure includes an alkyl structure and a benzene ring, for instance. Examples of such a second compound can include a low-molecular compound such as an amine-based compound, an alcohol-based compound, a phenol-based compound and a thiol-based compound.

The amine-based compound includes, for instance, ethylenediamine, propylenediamine, hexamethylenediamine, N,N,N',N',-tetraaminoethyl ethylene diamine, ortho-phenylenediamine, meta-phenylenediamine, para-phenylenediamine, N-N'-diphenyl-para-phenylenediamine, melamine, 2,4,6-triaminopyrimidine, and 1,5,9-triazacyclododecane.

The alcohol-based compound includes ethylene glycol, 1,2-dihydroxypropane, glycerol and 1,4-benzenedimethanol. The phenol-based compound includes 1,2-dihydroxybenzene, 1,3-dihydroxybenzene, 1,4-dihydroxybenzene, 1,2-dihydroxynaphthalene, resorcinol, fluoroglycerol, 2,3,4-trihydroxybenzaldehyde and 3,4,5-trihydroxybenzamide. The thiol-based compound includes ethylene dithiol and para-phenylene dithiol.

The gate insulating layers 18 and 28 in the transistors 100 and 200 in the present embodiment are formed of a cured substance of an insulating composition which contains the above-described first compound and second compound in combination. Here, the cured substance of the insulating composition is in a state of having a structure formed therein in which the first compound and the second compound are repeatedly bonded to each other, by a reaction caused between the first compound and the second compound. Such a reaction of the first compound and the second compound is caused by such a mechanism that a reactive functional group is firstly formed from a dissociable group in the first compound by the application of the electromagnetic radiations or heat, and the reactive functional group formed in the first compound subsequently reacts with the active hydrogen group in the second compound. Thus, an insulating composition can be cured by the application of the electromagnetic radiations or heat. The electromagnetic radiations is an electromagnetic wave having a predetermined wavelength, and for instance, X-rays, ultraviolet rays and the like correspond to the electromagnetic wave.

[Method for Manufacturing Organic Thin Film Transistor]

Next, preferred embodiments of a method for manufacturing an organic thin film transistor having the above-described structure will be described below.

Firstly, in the manufacture of a transistor 100 in a first embodiment, a substrate 10 is prepared, and a source electrode 12 and a drain electrode 14 are formed by depositing the above-described electroconductive material on this substrate 10 with a well-known method such as a vacuum vapor-deposition method, a sputtering method, a printing method and an ink jet method.

Subsequently, an organic semiconductor layer 16 is formed on the substrate 10 already having the source electrode 12 and the drain electrode 14 formed thereon so as to cover one part of each of these electrodes. The organic semiconductor layer 16 is preferably formed, for instance, by dissolving the above-described low-molecular or polymer organic semiconductor material into a dissolvable solvent, applying the solution onto the substrate and drying the solution.

As the solvent to be used here, any solvent is usable as long as the solvent can dissolve the organic semiconductor material, and preferably has a boiling point of 50° C. to 200° C. at normal pressure from the viewpoint of being removed by drying at as low a temperature as possible. The solvent includes an organic solvent such as chloroform, toluene, anisole, 2-heptanone and propylene glycol monomethyl ether acetate. The solution of the organic semiconductor material can be applied, for instance, with a spin coat method, a die coater method, a screen printing method, an ink jet method and the like.

Subsequently, an insulating layer 18 is formed on the substrate 10 already having the source electrode 12, the drain electrode 14 and the organic semiconductor layer 16 formed thereon so as to cover the electrodes and the layer. The insulating layer 18 can be formed by applying the above-described insulating composition, and curing the insulating composition. In the case of the transistor 100 to be manufactured in this first embodiment, the upper surface of the stacked structure in which the source electrode 12, the drain electrode 14 and the organic semiconductor layer 16 are formed on the substrate 10 corresponds to "face to have an insulating layer formed thereon". The detailed method for forming the insulating layer 18 will be described later.

After that, a gate electrode 19 is formed on the insulating layer 18 with the same method as that for the source electrode 12 and the drain electrode 14. Thereby, the transistor 100 of the first embodiment illustrated in FIG. 1 is obtained.

On the other hand, as for a transistor 200 of a second embodiment, firstly, a gate electrode 29 is formed on a substrate 20 in a similar way to that in the first embodiment. Subsequently, a gate insulating layer 28 is formed on the substrate 20 so as to cover this gate electrode 29. The method for forming the gate insulating layer 28 will be described later, but in the second embodiment, the upper surface of the stacked structure in which the gate electrode 29 is formed on the substrate 20 corresponds to "face to have an insulating layer formed thereon".

Then, a source electrode 22 and a drain electrode 24 are formed on the gate insulating layer 28, and an organic semiconductor layer 26 is formed thereon so as to cover one part of each of these electrodes. These operations can be conducted in a similar way to that in the first embodiment. The transistor 200 of the second embodiment illustrated in FIG. 2 is obtained by forming a topcoat 30 so as to cover the gate electrode 29, the gate insulating layer 28, the source electrode 22, the drain electrode 24 and the organic semiconductor layer 26 which have been formed on the substrate 20. The topcoat 30 is formed, for instance, of a polymer having fluorine atoms in the molecule and the like, and can be formed with a spin coating method, a dip coating method, a potting method, a spray method and the like.

The method for forming the gate insulating layers 18 and 28 in these transistors 100 and 200 will be specifically described below.

In the formation of the gate insulating layers 18 and 28, firstly, the above-described insulating composition is applied onto the face on which these gate insulating layers are to be formed. The insulating composition can be applied, for instance, in a state of a solution in which the insulating composition is dissolved in an organic solvent. The organic solvent to be used for this solution needs to be capable of dissolving components in the insulating composition therein, and is preferably, for instance, an organic solvent which has a boiling point of 100° C. to 200° C. at normal pressure because of being easily removed by drying. Such an organic solvent includes 2-heptanone and propylene glycol monomethyl ether acetate.

The solution containing the insulating composition can be applied with a spin coating method, a die coater method, a screen printing method, an ink jet method and the like. In addition, a leveling agent, a surface active agent, a curing catalyst and the like may be added to the solution of the insulating composition, as needed.

Next, the solution of the insulating composition applied in such a way as was described above is dried to remove the organic solvent, and thereby a layer formed of the insulating composition is formed. The drying can be performed by heating to a level of a temperature at which the organic solvent volatilizes. At this time, from the viewpoint of forming the transistor at a low temperature, it is preferable not to heat the solution up to an excessively high temperature.

Then, the gate insulating layers 18 and 28 can be formed by curing the layer formed of the insulating composition. The layers can be cured by irradiation with the electromagnetic radiations or by heating as was described above. For instance, when the first compound in the insulating composition has a block isocyanato group or a block isothiocyanato group as a dissociable group, the layer can be cured by heating.

In this case, the heating temperature is preferably 60 to 250° C., and more preferably is 80 to 200° C. If the heating temperature exceeds 250° C., when a plastic substrate is used, for instance, the expansion and contraction may not be sufficiently suppressed. On the other hand, if the heating temperature is lower than 60° C., the insulating composition is not sufficiently cured, and effects of reducing a leakage current, enhancing the withstand voltage and stabilizing hysteresis may not be sufficiently obtained.

In addition, in the method for manufacturing such transistors 100 and 200, a self-organization monomolecular film layer may be formed on the gate insulating layers 18 and 28 (not shown). By forming such a self-organization monomolecular film layer, effects such as further enhancement of the withstand voltage and improvement in transistor characteristics can be obtained.

The self-organization monomolecular film layer can be formed, for instance, by treating the gate insulating layers 18 and 28 with an alkyl chlorosilane compound or an alkyl alkoxysilane compound. It is considered that thus formed self-organization monomolecular film layer has a structure in which the alkyl chlorosilane compound or the alkyl alkoxysilane compound causes hydrolysis/condensation and the like, and has a form of interacting with the surfaces of the gate insulating layers 18 and 28 through an ion bond, a hydrogen bond and the like.

The film layer formed by the treatment of the alkyl chlorosilane compound or the alkyl alkoxysilane compound can be formed, for instance, by applying a solution in which these compounds are dissolved into the organic solvent so as to become 1 to 10 wt %, onto the gate insulating layers 18 and 28, and drying the solution.

The alkyl chlorosilane compound includes, for instance, methyl trichlorosilane, ethyl trichlorosilane, butyl trichlorosilane, decyl trichlorosilane and octadecyl trichlorosilane. The alkyl alkoxysilane compound includes methyl trimethoxysilane, ethyl trimethoxysilane, butyl trimethoxysilane, decyl trimethoxysilane and octadecyl trimethoxysilane.

[Display Member and Display]

Next, a display member and a display using the transistor according to the present invention will be described below. In the following description, a structure in which an organic EL device is used as a display is taken as an example, but the display which can be applied to the present invention is not limited to this display.

Figure 3:
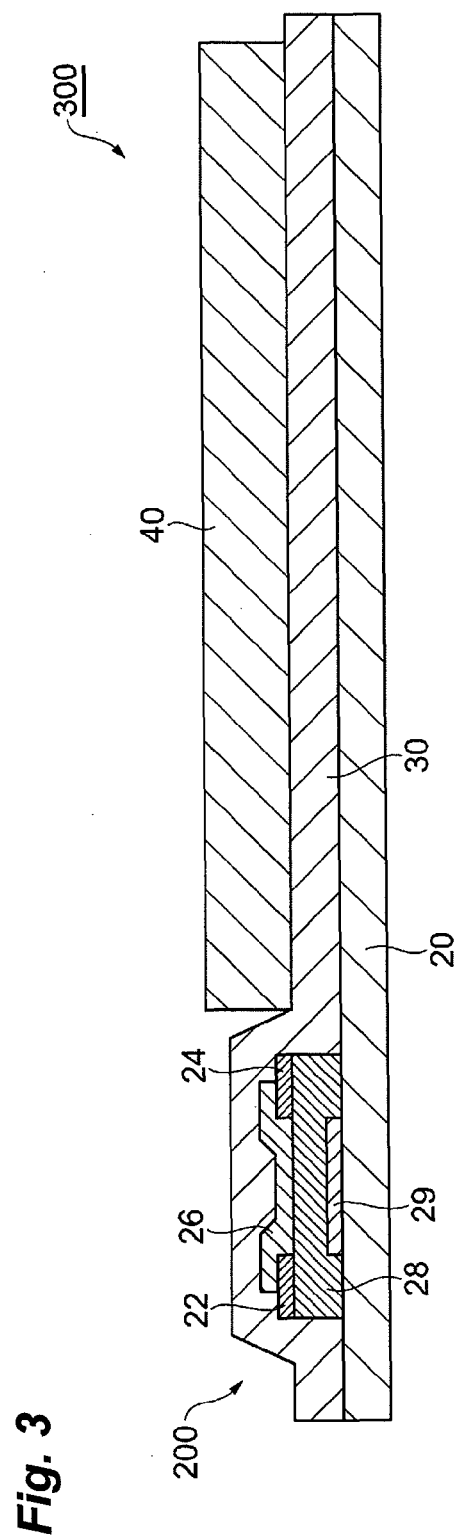
FIG. 3 is a view schematically illustrating a sectional structure of a display according to a preferred embodiment.

FIG. 3 is a view schematically illustrating a sectional structure of a display according to a preferred embodiment. As is illustrated in FIG. 3, the display 300 of the present embodiment has a structure having a transistor 200 and an organic EL device 40 provided therein. This display 300 constitutes one pixel in the display, and the transistor 200 is connected to the organic EL device 40 to control the light emission of this organic EL device 40. An actual display has a large number of such displays 300 provided therein and thereby can display an image.

In the display 300, the transistor 200 has the same structure as the above-described transistor 200 in the second embodiment. The substrate 20 in this transistor 200 extends to its plane direction, and serves as a substrate for mounting the organic EL device 40 thereon as well. In addition, a topcoat 30 in the transistor 200 is arranged between the substrate 20 and the organic EL device 40. An organic EL device having a well-known structure can be applied to the organic EL device 40.

Like such a display 300, the transistor 200 of one embodiment of the transistor according to the present invention can be preferably used as a display member to be used for a display. Such a transistor 200 can sufficiently suppress expansion and contraction of the substrate 20 even when a plastic plate is used as the substrate, for instance, because a gate insulating layer 28 which needs to be conventionally formed at a high temperature can be formed at a low temperature as was described above. When a device that may be shown in the display 300 is downsized so as to provide more pixels in the actual display, the deformation of the substrate tends to exert a large influence on display characteristics, but in the present embodiment, such a deformation of the substrate can be suppressed because the transistor 200 which can be formed at a low temperature is used as a display member, and the display 300 can be easily narrowed.

EXAMPLES

The present invention will be described further in detail below with reference to examples, but the present invention is not limited to these examples.

[Synthesis of First and Second Compounds]

Synthesis Example 1

A viscous 2-heptanone solution of a polymer compound 1 which was the first compound was obtained by charging 5.00 g of styrene (product made by Wako Pure Chemical Industries, Ltd.), 1.27 g of acrylonitrile (product made by Wako Pure Chemical Industries, Ltd.), 1.92 g of 2-[O-[1'-methyl propylidene amino]carboxyamino]ethyl-methacrylate (product made by Showa Denko K.K., trade name: Karenz MOI-BM), 0.08 g of 1,1'-azobis(cyclohexane carbonitrile) and 19.13 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 1 determined from the standard polystyrene was 107,000. (GPC made by Shimadzu Corporation, one column of Tskgel super HM-H+one column of Tskgel super H2000, and transfer phase=THF)

Synthesis Example 2

A viscous 2-heptanone solution of a polymer compound 2 which was the first compound was obtained by charging 1.00 g of styrene (product made by Wako Pure Chemical Industries, Ltd.), 0.51 g of acrylonitrile (product made by Wako Pure Chemical Industries, Ltd.), 0.51 g of 2-[O-[1'-methyl propylidene amino]carboxyamino]ethyl-methacrylate (product made by Showa Denko K.K., trade name: Karenz MOI-BM), 0.02 g of 1,1'-azobis(cyclohexane carbonitrile) and 18.20 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 2 determined from the standard polystyrene was 33,000. (GPC made by Shimadzu Corporation, one column of Tskgel super HM-H+one column of Tskgel super H2000, and transfer phase=THF)

Synthesis Example 3

A viscous 2-heptanone solution of a polymer compound 3 which was the first compound was obtained by charging 0.70 g of styrene (product made by Wako Pure Chemical Industries, Ltd.), 0.71 g of acrylonitrile (product made by Wako Pure Chemical Industries, Ltd.), 0.54 g of 2-[O-[1'-methyl propylidene amino]carboxyamino]ethyl-methacrylate (product made by Showa Denko K.K., trade name: Karenz MOI-BM), 0.02 g of 1,1'-azobis(cyclohexane carbonitrile) and 17.57 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 3 determined from the standard polystyrene was 37,000. (GPC made by Shimadzu Corporation, one column of Tskgel super HM-H+one column of Tskgel super H2000, and transfer phase=THF)

Synthesis Example 4

A viscous 2-heptanone solution of a polymer compound 4 which was the first compound was obtained by charging 3.90 g of styrene (product made by Wako Pure Chemical Industries, Ltd.), 1.00 g of 2-[O-[1'-methyl propylidene amino]carboxyamino]ethyl-methacrylate (product made by Showa Denko K.K., trade name: Karenz MOI-BM), 0.05 g of 1,1'-azobis(cyclohexane carbonitrile) and 11.43 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 4 determined from the standard polystyrene was 95,000. (GPC made by Shimadzu Corporation, one column of Tskgel super HM-H+one column of Tskgel super H2000, and transfer phase=THF)

Synthesis Example 5

A viscous 2-heptanone solution of a polymer compound 5 which was the first compound was obtained by charging 4.00 g of styrene (product made by Wako Pure Chemical Industries, Ltd.), 1.11 g of acrylonitrile (product made by Wako Pure Chemical Industries, Ltd.), 1.68 g of 2-[O-[1'-methyl propylidene amino]carboxyamino]ethyl-methacrylate (product made by Showa Denko K.K., trade name: Karenz MOI-BM), 0.70 g of allyl trimethyl germanium (product made by Chisso Corporation), 0.08 g of 1,1'-azobis (cyclohexane carbonitrile) and 15.84 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 5 determined from the standard polystyrene was 87,000. (GPC made by Shimadzu Corporation, one column of Tskgel super HM-H+one column of Tskgel super H2000, and transfer phase=THF)

Synthesis Example 6

A viscous 2-heptanone solution of a polymer compound 6 which was the second compound was obtained by charging 4.32 g of 4-aminostyrene (product made by Tokyo Chemical Industry Co., Ltd.), 0.04 g of 1,1'-azobis(cyclohexane carbonitrile) and 10.08 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 6 determined from the standard polystyrene was 18,000. (GPC made by Shimadzu Corporation, one column of Tskgel super HM-H+one column of Tskgel super H2000, and transfer phase=THF)

Synthesis Example 7

A viscous 2-heptanone solution of a polymer compound 7 which was the first compound was obtained by charging 5.00 g of styrene (product made by Wako Pure Chemical Industries, Ltd.), 1.27 g of acrylonitrile (product made by Wako Pure Chemical Industries, Ltd.), 2.01 g of 2-[N-[1',3'-dimethyl pyrazolyl]carboxyamino]ethyl-methacrylate (product made by Showa Denko K.K., trade name: Karenz MOI-BP), 0.08 g of 1,1'-azobis(cyclohexane carbonitrile) (product made by Sigma-Aldrich Corporation) and 19.33 g of 2-heptanone (product made by Wako Pure Chemical Industries, Ltd.) into a pressure-resistant container (product made by Ace Glass Incorporated) with the capacity of 50 ml, making nitrogen bubble in the mixture, sealing the container, and polymerizing the charged compounds in an oil bath of 60° C. for 48 hours.

The weight average molecular weight of the obtained polymer compound 7 determined from the standard polystyrene was 154,000. (GPC made by Shimadzu Corporation, one column of Tskgel super HM-H+one column of Tskgel super H2000, and transfer phase=THF)

Synthesis Example 8

A tetrahydrofuran solution of 1,3-phenylene diisocyanate was obtained by replacing the inner part of a three necked flask with the capacity of 500 ml with nitrogen, to which a balanced dropping funnel with the capacity of 50 ml, a three necked cock and a mechanical stirrer are attached, then charging 25.0 g of 1,3-phenylene diisocyanate (product made by Wako Pure Chemical Industries, Ltd.) and 250 ml of dehydrated tetrahydrofuran into the three necked flask, and stirring the mixture to dissolve the 1,3-phenylene diisocyanate. The reaction flask was placed in an ice bath, and butanone ketoxime (product made by Wako Pure Chemical Industries, Ltd.) was slowly added dropwise into the tetrahydrofuran solution of the 1,3-phenylene diisocyanate while the mixture liquid was stirred at 200 rpm.

After the addition was finished, the resultant mixture was reacted while being continuously stirred in the ice bath for 1 hour and then further being stirred at room temperature overnight, and a transparent and light yellow mixture was obtained. The obtained mixture was added dropwise into 1,000 ml of ion-exchanged water while the resultant mixture was stirred, the supernatant was then removed, and a viscous solid was obtained. The obtained solid was redissolved into 200 ml of ethanol, an insoluble matter was filtered with a filter paper, the ethanol was distilled off under a reduced pressure, and 1,3-di[O-(1'-methyl ethylidene amino)carboxyamino] benzene as the first compound was obtained in a viscous solid state. (The amount of the obtained viscous solid was 45 g.)

Example 1

(Preparation of Solution for Forming Insulating Layer)

A homogeneous solution was prepared by charging 1.00 g of a 2-heptanone solution of a polymer compound 1 which was the first compound, 0.017 g of hexamethylenediamine (made by Wako Pure Chemical Industries, Ltd.) which was the second compound, and 1.10 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 μm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured its film thickness with a profilometer (made by KLM-Tencor Japan Ltd.), the film thickness was 250 nm. As a result of having vapor-deposited an aluminum electrode on this insulating layer, and measured its dielectric breakdown voltage with the use of a vacuum prober (BCT22MDC-5-HT-SCU made by Nagase Electronic Equipments Service Co. LTD.), the insulating layer did not cause the dielectric breakdown even when 100 V was applied to the insulating layer. In addition, the leakage current when 100 V was applied thereto was $4.76 \times 10^{-12}$ A (electrode area=0.0314 cm$^2$).

(Preparation of Transistor)

A gate insulating layer was prepared by filtering the above-described solution for forming the insulating layer with the use of a membrane filter with pores of 0.2 μm, spin-coating the filtrate on a glass substrate provided with a chromium electrode (gate electrode), and heating the wet film on a hot plate at 150° C. for 90 minutes.

Subsequently, an application liquid was obtained by dissolving F8T2 (copolymer of 9,9-dioctyl fluorene:bithiophene=50:50 (molar ratio); weight average molecular weight=69,000 in terms of polystyrene) into chloroform which is a solvent to prepare a solution (organic semiconductor composition) with the concentration of 0.5 wt %, and then filtering the solution with a membrane filter.

An organic semiconductor layer with the thickness of approximately 60 nm was formed by applying the obtained application liquid onto the above-described gate insulating layer with a spin coating method. Subsequently, by forming a source electrode and a drain electrode on the organic semiconductor layer (having a structure with fullerene and gold stacked from an organic semiconductor layer side in this order), which had a channel length of 20 μm and a channel width of 2 mm with a vacuum deposition method with the use of a metal mask, a bottom gate type of an electric-field effect type organic thin-film transistor (transistor) was prepared.

(Evaluation for Characteristics of Transistor)

The characteristics of the obtained transistor were measured by using a vacuum prober (BCT22MDC-5-HT-SCU made by Nagase Electronic Equipments Service Co. LTD) on conditions that a gate voltage Vg was changed to 0 to −60 V and a voltage Vsd between the source and the drain was changed to 0 to −60 V. The obtained result is shown in Table 1.

In addition, the absolute value of the voltage difference between a threshold voltage $Vth_1$ obtained when the voltage Vsd between the source and the drain was −50 V and the gate voltage Vg was changed to 0 V to −60 V and a threshold voltage $Vth_2$ obtained when the gate voltage Vg was changed to −60 V to 0 V was determined on this transistor, and the value was defined as hysteresis.

Example 2

(Preparation of Solution for Forming Insulating Layer)

A homogeneous solution was prepared by charging 1.00 g of a 2-heptanone solution of a polymer compound 1 which was the first compound, 0.016 g of 1,4-phenylenediamine (product made by Wako Pure Chemical Industries, Ltd.) which was the second compound, and 1.10 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 250 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $4.12\times10^{-12}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 3

(Preparation of Solution for Forming Insulating Layer)

A homogeneous solution was prepared by charging 1.00 g of a 2-heptanone solution of a polymer compound 1 which was the first compound, 0.015 g of 1,4-dihydroxybenzene (product made by Wako Pure Chemical Industries, Ltd.) which was the second compound, and 1.10 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 250 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $1.60\times10^{-11}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 4

(Preparation of Solution for Forming Insulating Layer)

A homogeneous solution was prepared by charging 1.00 g of a 2-heptanone solution of a polymer compound 2 which was the first compound, 0.017 g of 1,4-phenylenediamine (product made by Wako Pure Chemical Industries, Ltd.) which was the second compound, and 1.10 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 380 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $2.85\times10^{-11}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 5

(Preparation of Solution for Forming Insulating Layer)

A homogeneous application solution was prepared by charging 1.00 g of a 2-heptanone solution of a polymer compound 3 which was the first compound, 0.019 g of 1,4-phenylenediamine (product made by Wako Pure Chemical Industries, Ltd.) which was the second compound, and 1.10 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 320 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $6.08\times10^{-11}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 6

(Preparation of Solution for Forming Insulating Layer)

A homogeneous solution was prepared by charging 1.00 g of a 2-heptanone solution of a polymer compound 4 which was the first compound, 0.015 g of 1,4-phenylenediamine (product made by Wako Pure Chemical Industries, Ltd.) which was the second compound, and 2.00 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 μm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 291 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $1.97\times10^{-8}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 7

(Preparation of Solution for Forming Insulating Layer)

A homogeneous solution was prepared by charging 3.00 g of a 2-heptanone solution of a polymer compound 5 which was the first compound, 0.041 g of 1,4-phenylenediamine (product made by Wako Pure Chemical Industries, Ltd.) which was the second compound, and 3.00 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 μm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 230 nm. As a result of having measured the dielectric breakdown voltage by using this insulating layer in a similar way to that in Example 1, the insulating layer did not cause the dielectric breakdown even when 80 V was applied to the insulating layer. In addition, the leakage current when 80 V was applied thereto was $1.55\times10^{-9}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 8

(Preparation of Solution for Forming Insulating Layer)

A homogeneous solution was prepared by charging 0.50 g of a 2-heptanone solution of a polymer compound 1 which was the first compound, 1.00 g of a 2-heptanone solution containing 42.4 wt. % of 2-(4'-hydroxyphenyl)ethyl-dimethylsilyl-polysilsesquioxane resin (BOPH resin; made by Toagosei Co., Ltd., weight average molecular weight=10,000 in terms of polystyrene) which was the second compound, and 2.30 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 μm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 376 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $6.66\times10^{-9}$ A (electrode area=0.0314 cm$^2$).

Example 9

(Preparation of Solution for Forming Insulating Layer)

A homogeneous solution was prepared by charging 0.45 g of a 2-heptanone solution of a polymer compound 1 which was the first compound, 0.50 g of a 2-heptanone solution of a polymer compound 6 which was the second compound, and 2.00 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 240 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $5.81 \times 10^{-7}$ A (electrode area=0.0314 cm$^2$).

Example 10

(Preparation of Solution for Forming Insulating Layer)

A homogeneous solution was prepared by charging 0.081 g of a 2-heptanone solution of a polymer compound 1 which was the first compound, 1.00 g of polyvinylphenol-co-polymethyl methacrylate (product made by Sigma-Aldrich Corporation) which was the second compound, and 7.00 g of propylene glycol monomethyl ether acetate into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 30 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 440 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $1.93 \times 10^{-8}$ A (electrode area=0.0314 cm$^2$).

Example 11

(Preparation of Solution for Forming Insulating Layer)

A homogeneous solution was prepared by charging 3.00 g of a 2-heptanone solution of a polymer compound 7 which was the first compound, 0.047 g of 1,4-phenylenediamine (product made by Wako Pure Chemical Industries, Ltd.) which was the second compound, and 4.20 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and baking the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 360 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $3.47 \times 10^{-8}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics were measured in the similar way. As a result, the threshold voltage (Vth) was −18.6 V and an ON/OFF ratio was $6.3 \times 10^{-5}$.

Example 12

(Preparation of Solution for Forming Insulating Layer)

A homogeneous solution was prepared by charging 1.00 g of polyvinylphenol (product made by Sigma-Aldrich Corporation and weight average molecular weight=8,000) which was the second compound, 0.10 g of 1,3-di[O-(1-methyl ethylideneamino)carboxyamino]benzene obtained in Synthetic Example 8 which was the first compound, and 7.40 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate on a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 319 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $2.79 \times 10^{-4}$ A (electrode area=0.0314 cm$^2$).

Example 13

(Preparation of Solution for Forming Insulating Layer)

A homogeneous solution was prepared by charging 1.00 g of polyvinylphenol (product made by Sigma-Aldrich Corporation and weight average molecular weight=8,000 in terms of polystyrene) which was the second compound, 0.30 g of 1,3-di[O-(1-methyl ethylideneamino)carboxyamino]benzene obtained in Synthetic Example 8 which was the first compound, and 8.70 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate on a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 256 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $5.98 \times 10^{-4}$ A (electrode area=$0.0314$ cm$^2$).

Example 14

(Preparation of Solution for Forming Insulating Layer)

A homogeneous solution was prepared by charging 1.00 g of poly(4-vinylphenol) (product made by Sigma-Aldrich Corporation, weight average molecular weight=8,000 in terms of polystyrene) which was the second compound, 0.60 g of 1,3-di[O-(1-methyl ethylidene amino)carboxyamino] benzene obtained in Synthetic Example 8 which was the first compound, and 8.70 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 203 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $1.48 \times 10^{-4}$ A (electrode area=$0.0314$ cm$^2$)

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Example 15

(Preparation of Solution for Forming Insulating Layer)

A homogeneous solution was prepared by charging 1.00 g of polyvinyl phenol-co-polymethyl methacrylate (product made by Sigma-Aldrich Corporation) which was the second compound, 0.10 g of 1,3-di[O-(1-methyl ethylidene amino) carboxyamino]benzene obtained in Synthetic Example 8 which was the first compound, and 7.40 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 289 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $5.37 \times 10^{-7}$ A (electrode area=$0.0314$ cm$^2$)

Example 16

(Preparation of Solution for Forming Insulating Layer)

A homogeneous solution was prepared by charging 1.00 g of polyvinyl phenol-co-polymethyl methacrylate (product made by Sigma-Aldrich Corporation) which was the second compound, 0.20 g of 1,3-di[O-(1-methyl ethylidene amino) carboxyamino]benzene obtained in Synthetic Example 8 which was the first compound, and 8.00 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 336 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $1.42 \times 10^{-7}$ A (electrode area=$0.0314$ cm$^2$).

Example 17

(Preparation of Solution for Forming Insulating Layer)

A homogeneous solution was prepared by charging 1.00 g of polyvinyl phenol-co-polymethyl methacrylate (product made by Sigma-Aldrich Corporation) which was the second compound, 0.30 g of 1,3-di[O-(1-methyl ethylidene amino) carboxyamino]benzene obtained in Synthetic Example 8 which was the first compound, and 8.70 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 150° C. for 90 minutes.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 298 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 100 V was applied thereto was $2.86 \times 10^{-7}$ A (electrode area=0.0314 cm$^2$).

(Preparation of Transistor and Evaluation for Characteristics)

A transistor was prepared in a similar way to that in Example 1 except that a solution for forming an insulating layer in the present example was used, and transistor characteristics and hysteresis were measured in the similar way. The obtained result is shown in Table 1.

Comparative Example 1

(Preparation of Solution for Forming Insulating Layer)

A homogeneous solution was prepared by charging 1.00 g of poly(4-vinylphenol) (product made by Sigma-Aldrich Corporation, weight average molecular weight=8,000 in terms of polystyrene), 0.194 g of a 1-butanol solution containing 84 wt % of a methylated product of poly(melamine-co-formaldehyde) (product made by Sigma-Aldrich Corporation) and 7.00 g of 2-heptanone into a sample bottle with the capacity of 10 ml, and dissolving the compound while stirring the mixture.

(Formation of Insulating Layer)

An insulating layer was obtained by filtering the obtained solution with the use of a membrane filter with pores of 0.2 µm, spin-coating the filtrate onto a silicon wafer, and heating the wet film on a hot plate at 200° C. for 1 hour.

(Evaluation for Solvent Resistance of Insulating Layer)

As a result of having added toluene or chloroform dropwise onto the obtained insulating layer, the insulating layer did not dissolve in the solvent.

(Evaluation for Withstand Voltage of Insulating Layer)

As a result of having peeled off one part of the insulating layer and having measured the film thickness in a similar way to that in Example 1, the film thickness was 380 nm. As a result of having measured the dielectric breakdown voltage by using this insulating layer in a similar way to that in Example 1, the insulating layer did not cause the dielectric breakdown even when 100 V was applied to the insulating layer. In addition, the leakage current when 80 V was applied thereto was $3.01 \times 10^{-7}$ A (electrode area=0.0314 cm$^2$)

(Preparation of Transistor and Evaluation for Characteristics)

A transistor was prepared in a similar way to that in Example 1 except that a solution for forming an insulating layer in the comparative example was used, and transistor characteristics and hysteresis were measured in the similar way. The obtained result is shown in Table 1.

TABLE 1

| Transistor | Example 1 | Example 2 | Example 3 | Example 4 | Example 5 | Example 6 | Example 7 | Example 14 | Example 17 | Comparative Example 1 |
|---|---|---|---|---|---|---|---|---|---|---|
| Threshold voltage (V) | −17 | −15 | −13 | −15 | −12 | −4 | −20 | −40 | −26 | −50 |
| ON/OFF | $1.9 \times 10^4$ | $4.5 \times 10^4$ | $3.9 \times 10^3$ | $7.4 \times 10^3$ | $3.4 \times 10^3$ | $1.4 \times 10^6$ | $6.3 \times 10^3$ | $1.1 \times 10^6$ | $1.5 \times 10^5$ | $1.1 \times 10^3$ |
| Hysteresis (V) $|Vth_1 - Vth_2|$ | 1.3 | 0.5 | 0 | 0.4 | 0.2 | 0.6 | 0.7 | 2.9 | 0.7 | 3.5 |

It was confirmed from the above result that the transistor in examples provided with a gate insulating layer which is formed from the insulating composition according to the present invention including the first and second compounds in combination firstly could have an insulating layer which could be formed at a temperature low enough not to cause the expansion and contraction of a plastic substrate, and had excellent solvent resistance and withstand voltage, had excellent transistor characteristics compared to the transistor in Comparative Example 1, and a stable hysteresis.

REFERENCE SIGNS LIST

10, 20 . . . Substrate, 12, 22 . . . Source electrode, 14, 24 . . . Drain electrode, 16, 26 . . . Organic semiconductor layer, 18, 28 . . . Gate insulating layer, 19, 29 . . . Gate electrode, 30 . . . Topcoat, 40 . . . Organic EL device, 100, 200 . . . Transistor, 300 . . . Display.

The invention claimed is:

1. An organic thin film transistor comprising a source electrode, a drain electrode, an organic semiconductor layer that becomes a current path between the source electrode and the drain electrode, a gate electrode that controls an electric current passing through the current path, and an insulating layer that insulates the organic semiconductor layer from the gate electrode, wherein
   the insulating layer is formed of a cured substance of a composition comprising a first compound having, in the molecule, two or more groups that produce a functional group that reacts with an active hydrogen group by electromagnetic radiations or heat, and a second compound having two or more active hydrogen groups in the molecule, where at least one of the first compound and the second compound is a polymer compound.

2. The organic thin film transistor according to claim 1, wherein the group that produces a functional group that reacts with an active hydrogen group by electromagnetic radiations or heat is a blocked isocyanato group or a blocked isothiocyanato group.

3. The organic thin film transistor according to claim 2, wherein the blocked isocyanato group or the blocked isothiocyanato group is a group represented by the following formula (1a) or a group represented by the following formula (1b):

[Chemical Formula 1]

(1a)

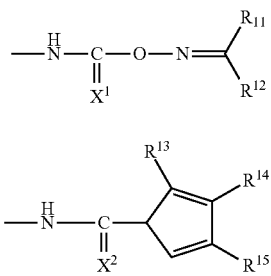

(1b)

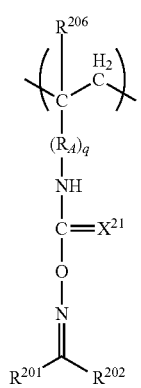

wherein $X^1$ and $X^2$ each independently represent an oxygen atom or a sulfur atom, and $R^{11}, R^{12}, R^{13}, R^{14}$ and $R^{15}$ each independently represent a hydrogen atom or a monovalent organic group having 1 to 20 carbon atoms.

4. The organic thin film transistor according to claim 1, wherein the first compound is a polymer compound including at least one structural unit selected from the group consisting of a structural unit represented by the following formula (2a) and a structural unit represented by the following formula (2b), and at least one structural unit selected from the group consisting of a structural unit represented by the following formula (2c), a structural unit represented by the following formula (2d) and a structural unit represented by the following formula (2e):

[Chemical Formula 2]

(2a)

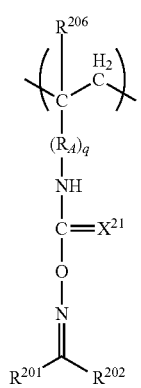

(2b)

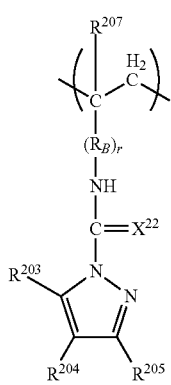

(2c)

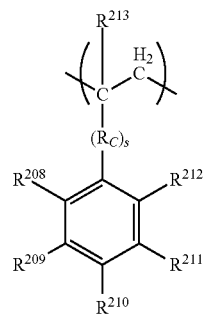

(2d)

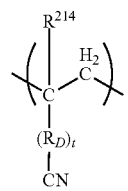

(2e)

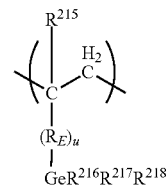

wherein $X^{21}$ and $X^{22}$ each independently represent an oxygen atom or a sulfur atom, $R^{201}$, $R^{202}$, $R^{203}$, $R^{204}$, $R^{205}$, $R^{206}$, $R^{207}$, $R^{208}$, $R^{209}$, $R^{210}$, $R^{211}$, $R^{212}$, $R^{213}$, $R^{214}$, $R^{215}$, $R^{216}$, $R^{217}$ and $R^{218}$ each independently represent a hydrogen atom or a monovalent organic group having 1 to 20 carbon atoms, $R_A$, $R_B$, $R_C$, $R_D$ and $R_E$ each independently represent a divalent organic group having 1 to 20 carbon atoms, and q, r, s, t and u are each independently an integer of 0 to 20.

5. A method for manufacturing an organic thin film transistor comprising a source electrode, a drain electrode, an organic semiconductor layer that becomes a current path between the source electrode and the drain electrode, a gate electrode that controls an electric current passing through the current path, and an insulating layer that insulates the organic semiconductor layer from the gate electrode, wherein the insulating layer is formed on a face to have the insulating layer formed thereon, by applying a composition comprising a first compound having, in the molecule, two or more groups that produce a functional group that reacts with an active hydrogen group by electromagnetic radiations or heat, and a second compound having two or more active hydrogen groups in the molecule, where at least one of the first compound and the second compound is a polymer compound, and curing the composition.

6. A display member comprising the organic thin film transistor according to claim 1.

7. A display comprising the display member according to claim 6.

* * * * *